(12) United States Patent
Loechelt

(10) Patent No.: US 10,236,342 B2
(45) Date of Patent: Mar. 19, 2019

(54) ELECTRONIC DEVICE INCLUDING A TERMINATION STRUCTURE

(71) Applicant: SEMICONDUCTOR COMPONENTS INDUSTRIES, LLC, Phoenix, AZ (US)

(72) Inventor: Gary H. Loechelt, Tempe, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/481,523

(22) Filed: Apr. 7, 2017

(65) Prior Publication Data
US 2018/0294332 A1    Oct. 11, 2018

(51) Int. Cl.
*H01L 29/78*      (2006.01)
*H01L 29/06*      (2006.01)
*H01L 29/10*      (2006.01)
*H01L 29/36*      (2006.01)
*H01L 29/08*      (2006.01)
(Continued)

(52) U.S. Cl.
CPC ...... *H01L 29/0634* (2013.01); *H01L 29/0657* (2013.01); *H01L 29/0847* (2013.01); *H01L 29/1095* (2013.01); *H01L 29/36* (2013.01); *H01L 29/4236* (2013.01); *H01L 29/66568* (2013.01); *H01L 29/66681* (2013.01); *H01L 29/78* (2013.01); *H01L 29/7823* (2013.01); *H01L 29/7825* (2013.01)

(58) Field of Classification Search
CPC ......... H01L 29/66272; H01L 29/66666; H01L 29/66712; H01L 29/66734; H01L 29/7902; H01L 29/0634; H01L 29/7823; H01L 29/7825
See application file for complete search history.

(56) References Cited

U.S. PATENT DOCUMENTS 6,215,168 B1    4/2001  Brush et al.
6,677,626 B1    1/2004  Shindou et al.
(Continued)

OTHER PUBLICATIONS

Y. Hattori et al., "Design of a 200V Super Junction MOSFET with n-buffer regions and its Fabrication by Trench Filling," Proceedings of 2004 International Symposium on Power Semiconductor Devices & ICs, Kitakyushu, pp. 189-192, 2004.

*Primary Examiner* — Galina G Yushina
(74) *Attorney, Agent, or Firm* — Abel Law Group, LLP

(57) ABSTRACT

An electronic device can include a termination structure that includes a substrate, a semiconductor layer, and a first trench. The substrate includes a semiconductor material of a first conductivity type. The semiconductor layer has a second conductivity type opposite the first conductivity type and overlies the substrate and has a primary surface. The first trench extends through a majority of a thickness of the semiconductor layer. In an embodiment, a body extension region of the second conductivity type is adjacent to the primary surface and spaced apart from the first trench. In another embodiment, a doped region of the first conductivity type is adjacent to the primary surface and abuts the first trench. In a further embodiment, the termination structure can include a second trench extending through a majority of the thickness of the semiconductor layer and a doped region is spaced apart from the first and second trenches.

20 Claims, 6 Drawing Sheets

(51) Int. Cl.
*H01L 29/66* (2006.01)
*H01L 29/423* (2006.01)

(56) References Cited

U.S. PATENT DOCUMENTS

| | | | |
|---|---|---|---|
| 7,679,146 B2 | 3/2010 | Tu et al. | |
| 7,902,601 B2 | 3/2011 | Loechelt et al. | |
| 8,564,058 B1 | 10/2013 | Hsieh | |
| 8,753,935 B1 | 6/2014 | Bobde et al. | |
| 9,620,585 B1* | 4/2017 | Loechelt | H01L 29/0634 |
| 2006/0180858 A1* | 8/2006 | Loechelt | H01L 29/0634 |
| | | | 257/341 |
| 2006/0289928 A1 | 12/2006 | Takaya et al. | |
| 2007/0102773 A1 | 5/2007 | Hisatomi et al. | |
| 2007/0278565 A1 | 12/2007 | Tu et al. | |
| 2008/0035987 A1 | 2/2008 | Hebert | |
| 2009/0085105 A1* | 4/2009 | Su | H01L 29/66719 |
| | | | 257/330 |
| 2009/0090967 A1 | 4/2009 | Chen et al. | |
| 2009/0108342 A1 | 4/2009 | Wang et al. | |
| 2010/0072544 A1* | 3/2010 | Pearse | H01L 29/407 |
| | | | 257/331 |
| 2011/0079843 A1 | 4/2011 | Darwish et al. | |
| 2011/0272759 A1 | 11/2011 | Bol | |
| 2011/0316075 A1* | 12/2011 | Hsieh | H01L 29/66825 |
| | | | 257/330 |
| 2012/0018800 A1 | 1/2012 | Kim | |
| 2012/0037954 A1* | 2/2012 | Hshieh | H01L 29/0638 |
| | | | 257/139 |
| 2012/0074489 A1 | 3/2012 | Hsieh | |
| 2012/0187527 A1 | 7/2012 | Guitart et al. | |
| 2012/0292694 A1 | 11/2012 | Hsieh | |
| 2012/0326227 A1 | 12/2012 | Burke et al. | |
| 2013/0043526 A1 | 2/2013 | Iyer et al. | |
| 2013/0221428 A1 | 8/2013 | Venkatraman et al. | |
| 2014/0103421 A1 | 4/2014 | Hossain et al. | |
| 2014/0103428 A1 | 4/2014 | Kim | |
| 2014/0217496 A1 | 8/2014 | Kachi | |
| 2014/0295632 A1 | 10/2014 | Lee et al. | |
| 2014/0353748 A1* | 12/2014 | Ma | H01L 29/0634 |
| | | | 257/334 |
| 2016/0284838 A1 | 9/2016 | Qin et al. | |

* cited by examiner

ELECTRONIC DEVICE INCLUDING A TERMINATION STRUCTURE

FIELD OF THE DISCLOSURE

The present disclosure relates to electronic devices including terminating structures and processes of forming such electronic devices.

RELATED ART

Power transistors can operate at voltages of 50 V and higher. The periphery of a die may be maintained at the drain voltage, and an active region of the electronic device can be in the interior of the die. A termination structure is maintained between the periphery of the die and the active region, so that the source and drain of the device do not break down at an unacceptably low voltage. Like the active region, a termination structure blocks voltage in an off-state, but unlike the active region, a termination structure does not have to pass current in an on-state. As the voltage between the source and drain increases, more robust termination structures are used.

Tradeoffs may be involved in the design of the electronic device. On-state resistance is to be small while the breakdown voltage between the source and drain is maintained at an acceptable level. Superjunction devices that have adjacent layers of oppositely-doped semiconductor to provide charge carriers for on-state conduction and depletion regions (equivalent to carrier-less "intrinsic" semiconductor material) for off-state current blocking.

Nevertheless, existing superjunction construction technologies suffer from a number of shortcomings, including limited pitch (causing semiconductor area to be wasted) and termination difficulty. The former shortcoming can result in relatively large termination structures, and the later shortcoming may limit device reliability and yield.

BRIEF DESCRIPTION OF THE DRAWINGS

Embodiments are illustrated by way of example and are not limited in the accompanying figures.

Figure 1:
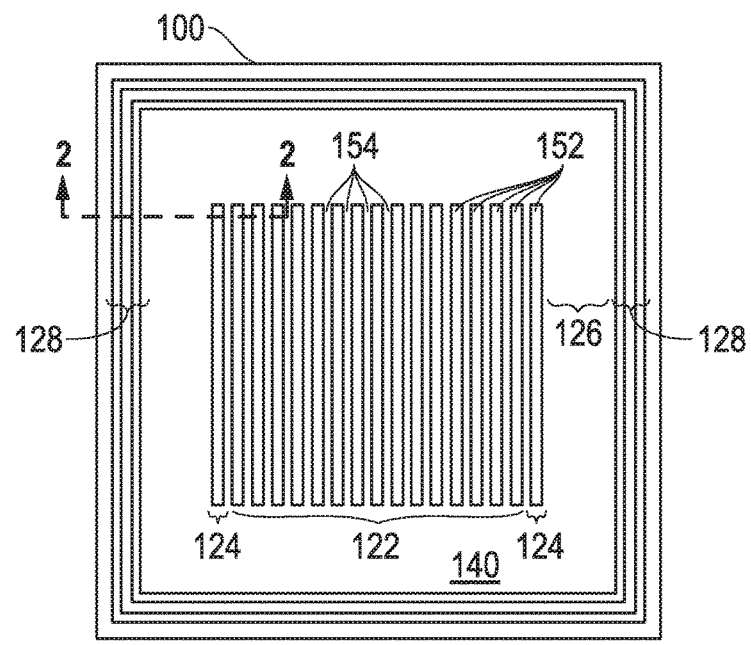
FIG. 1 includes an illustration of a top view of a semiconductor die illustrating trenches and regions of the semiconductor die.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

In the following description, the terms "intrinsic", "lightly-doped", "moderately-doped", and "heavily-doped", and "degenerate" are employed to indicate relative degrees of doping. These terms are not intended to indicate definitive numerical ranges, but rather to indicate relative dopant concentration levels. Approximate ranges whose upper and lower extremes may be allowed to vary by a factor of 4 in either direction. For example, with silicon, the term "intrinsic" can indicate a dopant concentration of $10^{14}$ atoms/cm$^3$ or less, "lightly-doped" can indicate a concentration in the range between $10^{14}$ and $10^{16}$ atoms/cm$^3$, "moderately-doped" can indicate a concentration in the range of $10^{16}$ to $10^{18}$ atoms/cm$^3$, inclusive, and "heavily-doped" can indicate a concentration in the range of $10^{18}$ to $10^{20}$ atoms/cm$^3$. "Degenerate" indicates a doping level sufficient to provide an ohmic (non-rectifying) connection with a metal contact (generally greater than $10^{20}$ atoms/cm$^3$). Note that for semiconductors other than silicon, these ranges may vary.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a termination structure that is more robust as compared to conventional designs. The termination structure can be designed to support a higher drain-to-source breakdown voltage as compared to a conventional design of the same geometry or may be narrower than the conventional design and still support the same drain-to-source voltage. The termination structures described herein can be used at drain-to-source voltages of 100 V to 900 V and higher, and are particularly well suited for drain-to-source voltages of 200 V to 400 V.

A body extension region can be used and be spaced apart from a trench near the active region side of the termination structure. The location of the body extension region can help to reduce the electrical field along the active region side of the termination structure. An inner drain extension region may abut the trench. The inner drain extension region can help to reduce the electrical field between the substrate and the primary surface along the active region side of the termination structure. A floating doped region can be located along the primary surface between the trench and another trench that is within a field-stop region. The floating doped region can help to make a uniform electrical field along the primary surface within an intermediate region.

In a set of embodiments, an electronic device can include a termination structure that includes a substrate, a semiconductor layer, and a first trench. The substrate can include a semiconductor material of a first conductivity type, and the semiconductor layer can have a second conductivity type opposite the first conductivity type. The semiconductor layer can overlie the substrate and has a primary surface. The first trench can extend through a majority of a thickness of the semiconductor layer. In an embodiment, the termination structure can further include a body extension region of the second conductivity type adjacent to the primary surface and spaced apart from the first trench. In another embodiment, the termination structure can further include a doped region of the first conductivity type that is adjacent to the primary surface and abutting the first trench. In a further embodiment, the termination structure can further include a second trench and a doped region. The second trench can extend through a majority of the thickness of the semiconductor layer and be spaced apart from the first trench. The doped region can have the first conductivity type and be adjacent to the primary surface and spaced apart from the first and second trenches.

The electronic device, and particularly, the termination structure, is better understood after reading this specification in conjunction with the figures.

FIG. 1 includes of a top view of the semiconductor die 100 with only a primary surface 140, trenches 152, and pillars 154 illustrated. Pillars 154 are portions of a semiconductor layer between the closely spaced trenches 152. A substrate, one or more other underlying semiconductor layers, doped regions, insulating layers, and metallization are not illustrated in FIG. 1 to simplify understanding positional relationships between the trenches and other parts of the semiconductor die 100. The semiconductor includes an active region 122, current barrier regions 124, an intermediate region 126 surrounding the active region 122 and current barrier regions 124, and a field-stop region 128 surrounding the intermediate region 126. The termination structure includes the current barrier region 124, the intermediate region 126, and the field-stop region 128. In the embodiment as illustrated, the active region 122 and current barrier regions 124 include 17 trenches 152 and 16 pillars 154, and the field-stop region 128 includes two trenches 152 and one pillar 154.

After reading this specification, skilled artisans will understand that the features are not drawn to scale, and that the active region 122 can occupy a greater fraction of the semiconductor die 100 than is illustrated. For example, in practice the active region 122 can include thousands of trenches 152 and thousands of pillars 154. Further, other physical designs are possible. At the borders of the active region 122 and the current barrier regions 124 are two pillars 154. In another embodiment, the current barrier region 124 can include more trenches 152 and pillars 154. In an alternative embodiment, the trenches 152 within the current barrier regions 124 may be in the form of an annular structure that surrounds the active region 122, rather than lying at opposite ends of the active region 122. In the alternative embodiment, the trenches 152 within the current barrier region 124 are replaced with a trench that surrounds the active region 122. In still another embodiment, the field-stop region 128 can include more trenches 152 and pillars 154 than is illustrated in FIG. 1. Furthermore, trenches 152 in the field-stop region 128 do not need to be continuous, but may be segmented with small gaps to improve process margin, increase mechanical stability, or for some other reason. The particular physical design of semiconductor die 100, including its termination structure, can be tailored for a particular operating voltage, breakdown voltage or application.

The figures that follow include cross-sectional views along sectioning line 2-2 in FIG. 1 to illustrate better features of the semiconductor die 100 and improve understanding of the fabrication process in forming the semiconductor die 100.

Figure 2:
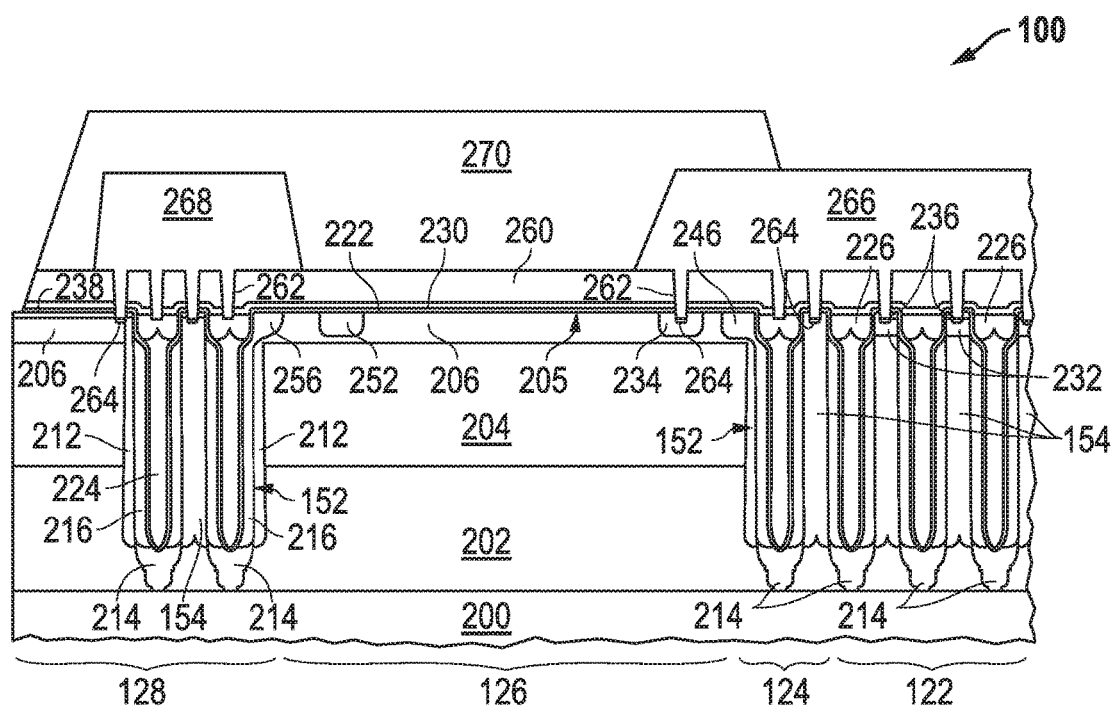
FIG. 2 includes an illustration of a cross-sectional view of a portion of a power electronic device near an edge of a semiconductor die.
Figure 3:
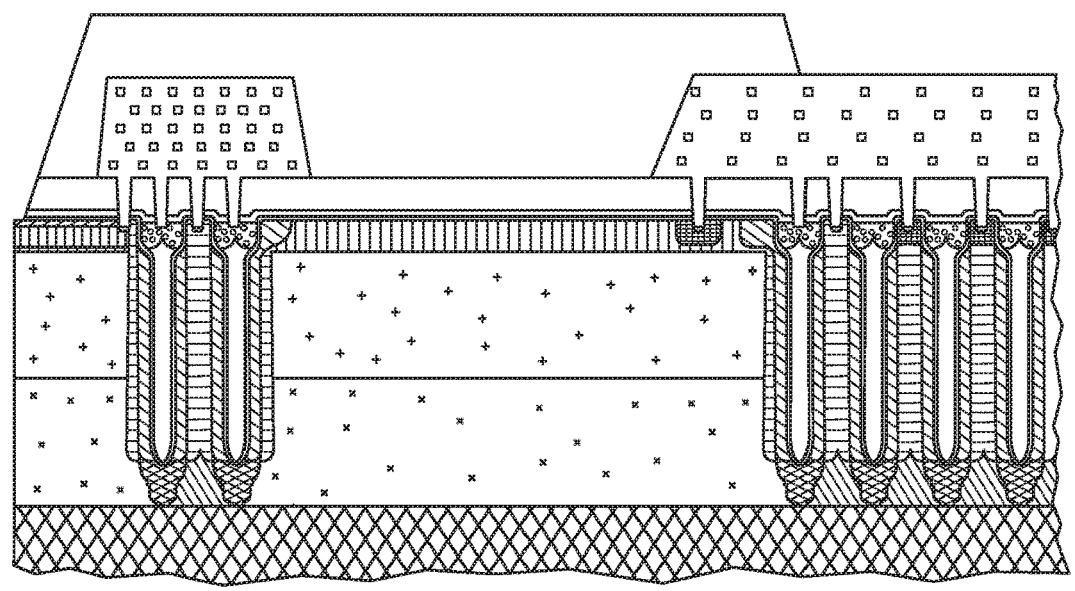
FIG. 3 includes an illustration of a cross-sectional view of the portion of FIG. 2, further including information on conductivity types and exemplary dopant concentrations of a substrate, semiconductor layers, and doped regions.

FIG. 2 includes a substantially completed semiconductor die 100. In FIG. 2, portions of active region 122, current barrier region 124, intermediate region 126, and the field-stop region 128 are illustrated. The semiconductor die 100 includes a semiconductor substrate 200, first and second epitaxial layers 202 and 204, a doped region 206, trenches 152, charge compensation regions 212, doped regions 214 between the bottoms of the trenches 152 and the substrate 200, portions of a superjunction layer 216, a trench liner 222, trench fill regions 224, surface-doped drain regions 246, 252, and 256, gate electrodes 226, a body region 232 (illustrated in FIG. 4), a body extension region 234, source regions 236, a seal layer 230, an interlayer dielectric 260, contact openings 262, body contact regions 264, a source electrode 266, a drain seal ring 268, and a passivation layer 270. A gate terminal is present within the active region 122 but is not illustrated in FIG. 2. Exemplary dopant concentrations of the various regions are illustrated in FIG. 3 for a power n-channel FET embodiment. Each of these features is described in more detail in the paragraphs that follow.

In the description of the process, some operations are well known are at not described; however, after reading this specification, skilled artisans will understand such operations can be performed when desired or needed. For example, before forming a doped region within a layer, a screen oxide layer may be formed to reduce the effects of implant channeling, particularly when $^{11}B^+$ is used are the species during implant. The screen oxide layer may or may not be removed. Further, an anneal may be formed after a doping with one or a plurality of dopants. Thus, the anneal may be performed as the next operation or may be deferred until later in the process flow. Still further, an oxide layer may be grown and removed at one or more particular points in the process to smooth an exposed surface of a semiconductor material.

Figure 4:
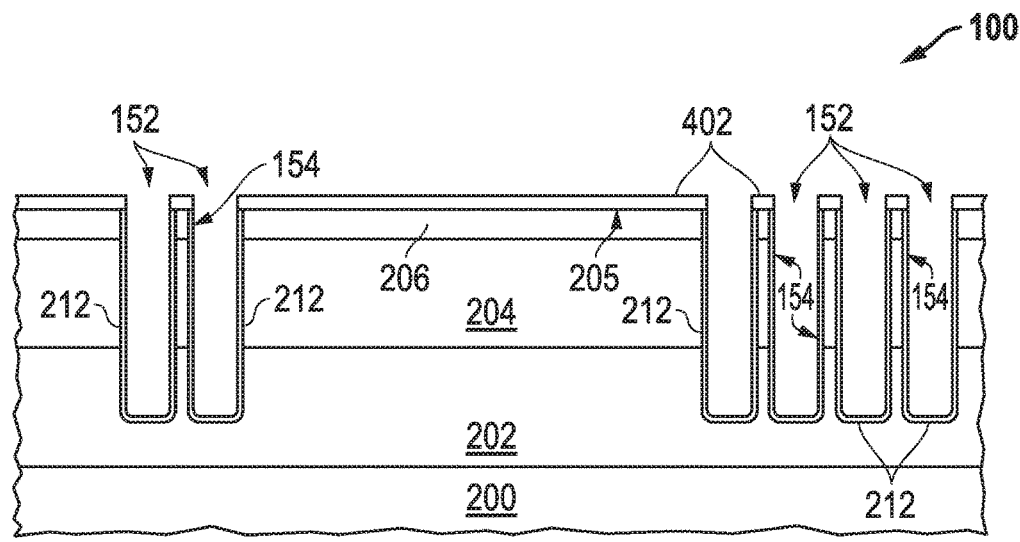
FIG. 4 includes an illustration of a cross-sectional view of a portion of a workpiece after forming semiconductor layers over a substrate, trenches, and doped regions along the primary surface and within the trenches.

FIG. 4 includes an illustration of a cross-sectional view of a portion of a workpiece early in the fabrication process. The substrate 200 can be a heavily doped semiconductor material, such as n-type silicon, and has a resistivity in a range of 1 milliohm-cm to 3 milliohm-cm. Semiconductor layers 202 and 204 are deposited. In an embodiment, the semiconductor layers 202 and 204 are epitaxially grown silicon layers. In a particular embodiment, the semiconductor layer 202 is in a range of 4 microns to 6 microns and has a phosphorus concentration of at most $1 \times 10^{16}$ atoms/cm$^3$, and the semiconductor layer 204 is in a range of 4.6 microns to 6.4 microns and has a boron concentration of at most $1 \times 10^{16}$ atoms/cm$^3$. The upper surface of the semiconductor layer 204 as originally formed is a primary surface 205. The semiconductor layers 202 and 204 create a vertical diode within the intermediate region 126. The thicknesses for the semiconductor layers 202 and 204 are suitable for a transistor with a nominal operating voltage of approximately 200 V. Commensurately thinner or thicker semiconductor layers 202 and 204 can be used to achieve a transistor with a nominal operating voltage different from 200 V.

In another embodiment, a single layer of intrinsic (un-doped) or lightly doped silicon of either conductivity type may be used in place of the semiconductor layers 202 and 204. In a further embodiment, the semiconductor layers 202 and 204 can be replaced with a moderately doped semiconductor layer that operates in the role of the charge compensation regions 212 (described further below). Although the semiconductor layers 202 and 204 are illustrated in FIG. 3 as single dopant density layers, one of both of the semiconductor layers 202 and 204 may alternatively have a graded doping profile to assist with the charge balance control within the active region 122.

The doped region 206 is formed within the semiconductor layer 204 at the primary surface 205. The doped region 206 can be formed using a blanket implant. In a particular embodiment, the doped region 206 has a conductivity type that is opposite the substrate 200, and in an embodiment is p-type doped and has a peak dopant concentration in a range of $3 \times 10^{15}$ atoms/cm$^3$ to $3 \times 10^{16}$ atoms/cm$^3$. The peak dopant concentration of the doped region 206 is at a depth of 0.8 micron to 1.2 microns below the primary surface 205.

A patterned hard mask layer 402 is formed and can include a relatively thick oxide layer (e.g., 0.3 micron to 0.8 micron). In an embodiment, widths of the openings in the hard mask layer 402 provide trench widths of 1.8 microns to 2.4 microns and a pitch, center-to-center separation of trenches, of 3.2 microns to 4.0 microns. The widths and pitch may vary with the desired operating characteristics of the device. In particular, a pitch as small as 2.6 microns may be used.

The semiconductor layers 202 and 204 are etched to define the trenches 152, which correspond to the trenches 152 in FIG. 1. The trenches 152 extend through the doped region 206 and at least a majority of the thicknesses of the semiconductor layers 202 and 204. In the embodiment illustrated, the trenches 152 extend through the entire thicknesses of the doped region 206 and the semiconductor layer 204 but not through the entire thickness of the semiconductor layer 202. The thickness of the remaining portion of the semiconductor layer 202 between the trench bottoms and the substrate 200 is in a range of 1 micron to 2 microns. In another embodiment, the bottom of the trenches may extend to the substrate 200.

The width of the intermediate region 126 depends on the voltage that is to be supported by the termination structure. When the intermediate region 126 is used in an electronic device designed for a nominal drain-to-source voltage of 200 V, the width of the intermediate region 126 may be at least 20 microns. Although the intermediate region 126 may not have a theoretical limitation on size, practical concerns may limit the width. For example, if the intermediate region 126 is too wide, the active region 122 will be too smaller, which is undesired. Thus, the width of the intermediate region 126 may be at most 40 microns for a nominal drain-to-source voltage of 200 V.

Figure 5:
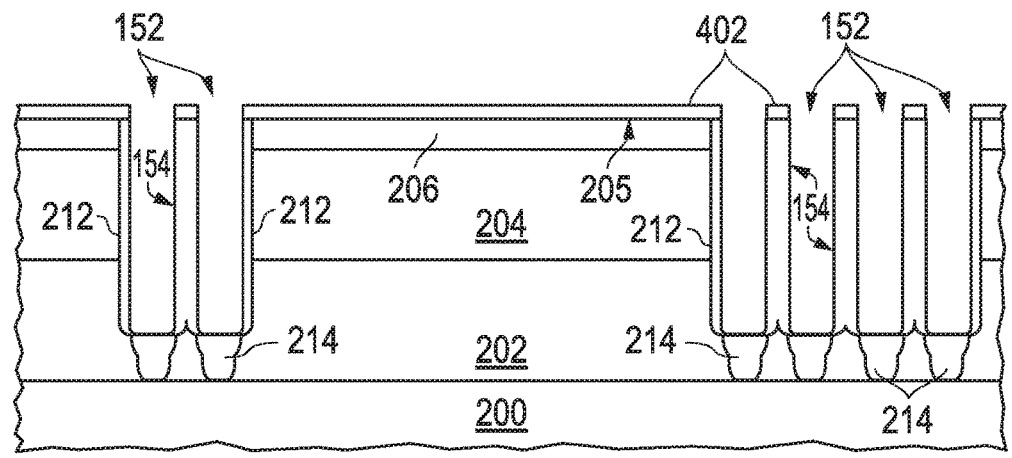
FIG. 5 includes an illustration of a cross-sectional view the workpiece of FIG. 4 after forming doped regions adjacent to surfaces along the trenches.

In an embodiment, the charge compensation regions 212 are formed along sidewalls of the trenches 152, as illustrated in FIG. 5. In an embodiment, the charge compensation regions 212 are formed using ion implant. In one embodiment, boron ($^{11}B^+$) ions are implanted to a total dose in a range of $1.0 \times 10^{13}$ ions/cm$^2$ to $4.0 \times 10^{13}$ ions/cm$^2$ at an energy in a range of 25 to 40 keV with a 10° tilt angle. In a particular embodiment, the total dose can be introduced as four implants at ¼ of the total dose with a 90° rotation of the substrate 200 between the implants. The effective implant and depth may be reduced when a screen oxide layer is present. Because of the small angle between the ion implant and the trench sidewall, the ion implant along the sidewall would be equivalent to an ion implant perpendicular to the surface with an effective dose in the semiconductor layers 202 and 204 along the sidewalls of the trenches 152 in a range of $3.0 \times 10^{12}$ ions/cm$^2$ to $7.0 \times 10^{12}$ ions/cm$^2$ ions/cm$^2$. In subsequent thermal diffusion steps, the dopant will diffuse to create the charge compensation regions 212, and, in a particular embodiment, extend throughout the pillars 154 between adjacent trenches 152.

Sidewalls spacers (not illustrated) can be formed in the trenches 152 to protect sidewalls of the trenches 152 and expose portions of the semiconductor layer 202 at the bottoms of the trenches 152. If needed or desired, some of the semiconductor layer 202 along the bottoms of trenches 152 may be etched to remove dopant of the opposite conductivity type from the semiconductor layer 202. When the substrate 200 has n-type conductivity, the p-type dopant, introduced during ion implantation when forming the charge compensation regions 212, along the bottom of the trenches 152 may be removed. In an embodiment, no more than 0.4 micron is removed.

In another embodiment, the charge compensation regions 212 can be formed from a deposited doped semiconductor layer. The semiconductor layer can be formed by epitaxially growing a p-type semiconductor layer along sidewalls of the trenches 152. The semiconductor layer may or may not include a thin buffer layer of intrinsic semiconductor material. Portions of the semiconductor layer are etched to remove the semiconductor layer over the hard mask layer 402 and along the bottoms of the trenches 152. As before, dopant in the remaining portions of the semiconductor layer can be diffused into the semiconductor layers 202 and 204 during subsequent thermal operations to create the charge compensation regions 212.

If needed or desired, the bottoms of the trenches 152 can be doped to reduce resistance between the charge compensation regions 212 and the substrate 200. In an embodiment, the doped regions 214 are formed within the semiconductor layer 202 adjacent to the bottoms of the trenches 152. In a particular embodiment, two implants may be performed, one with arsenic and the other with phosphorus. In a finished device, the different dopant species provide the distinctive shape seen with the doped regions 214. Thus, the doped regions 214 in FIG. 5 illustrate the doped regions 214 as seen in the finished device, not as originally formed. In another embodiment, one implant may be performed, and in another embodiment, the same implant species may be used for the two implants. The peak dopant concentration within the doped regions 214 can be greater than $2 \times 10^{17}$ atoms/cm$^3$. At this point in the process, the sidewall spacers within the trenches may be removed.

Figure 6:
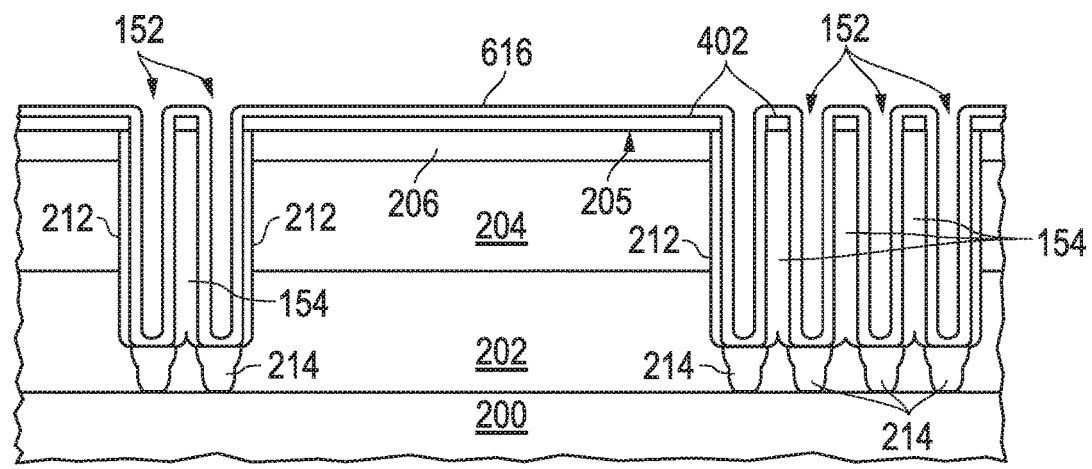
FIG. 6 includes an illustration of a cross-sectional view the workpiece of FIG. 5 after forming a superjunction layer.

The superjunction layer 216 may be formed from a doped semiconductor layer 616 as illustrated in FIG. 6. In an embodiment, the doped semiconductor layer 616 can be epitaxially grown from exposed portions of the semiconductor material within the trenches 152. If a non-selective epitaxy process is used, the portion of the doped semiconductor layer 616 formed over the hard mask layer 402 will be polycrystalline. If a selective epitaxy process is used, there will be substantially no semiconductor layer 616 formed over the hard mask layer 402. In an embodiment, the doped semiconductor layer 616 has a thickness in a range of 0.5 microns to 1.2 microns. In a particular embodiment, the doped semiconductor layer 616 includes a buffer film of 40 nm to 120 nm of intrinsic semiconductor material adjacent to the charge compensation regions 212, an intermediate film of 200 nm to 600 nm of n-type semiconductor having a dopant concentration in a range of $2 \times 10^{16}$ to $4 \times 10^{16}$ atoms/cm$^3$, and an inner film of 200 nm to 600 nm of intrinsic semiconductor material. The buffer film helps to reduce mutual counter-doping between the charge compensation region 212 and the intermediate film of the doped semiconductor layer 616. The intermediate film is as thick as reasonable possible to provide high electron mobility for the trenches 152.

Figure 7:
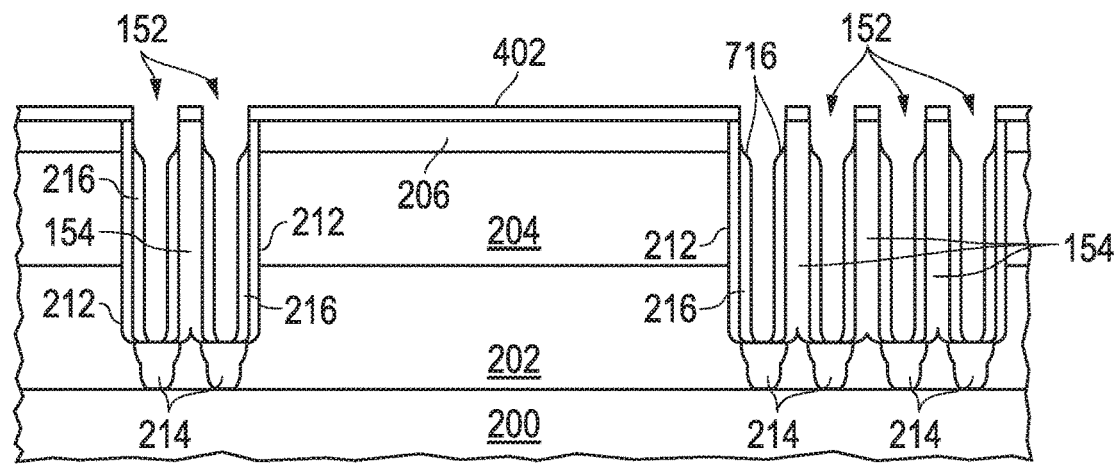
FIG. 7 includes an illustration of a cross-sectional view the workpiece of FIG. 6 after removing portions of the superjunction layer.

An anisotropic etch is performed to remove portions of the doped semiconductor layer 616 overlying the hard mask layer 402 and along the bottoms of the trenches 152. The etch can be extended to recess the doped semiconductor layer 616 such that a highest elevation of the doped semiconductor layer 616 is 400 nm to 800 nm below an elevation of the primary surface 205. At this point in the process, as illustrated in FIG. 7, the superjunction layer 216 is formed from the doped semiconductor layer 616. The recess etch forms the shoulder 716 of the superjunction layer 216. The hard mask layer 402 can be removed at this point in the process.

In a finished device, charge compensation regions 212 are p-type and electrically connected to a subsequently formed source electrode adjacent to the primary surface 205, and the superjunction layers 216 are n-type and coupled to the substrate 200.

Figure 8:
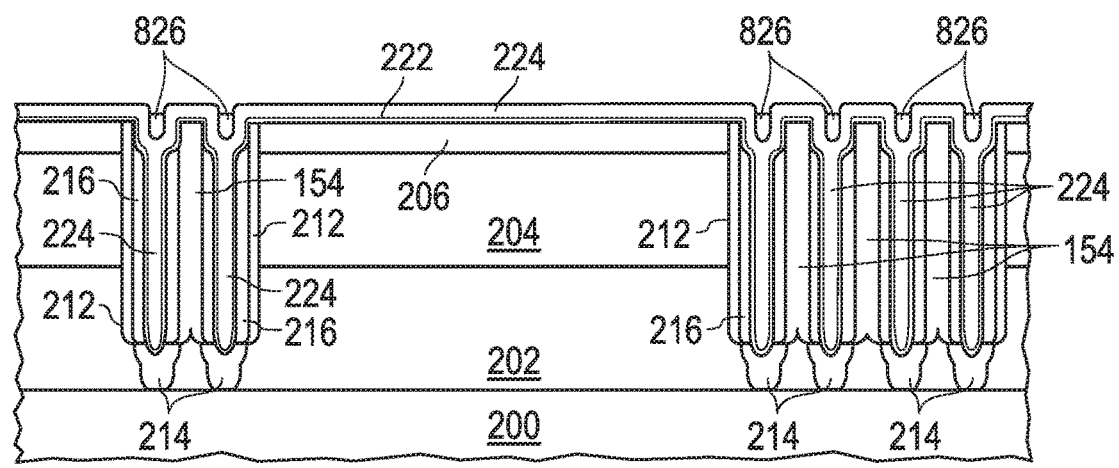
FIG. 8 includes an illustration of a cross-sectional view the workpiece of FIG. 7 after depositing a trench liner and a trench fill material and forming semiconductor islands.

In FIG. 8, trench liner 222 can be formed within the trenches 152 and over the primary surface 205. The trench liner 222 can have a thickness in a range of 30 nm to 150 nm. In an embodiment, the trench liner 222 can include a gate dielectric layer and a nitride film to protect the gate dielectric layer during subsequent processing. If the gate dielectric layer is formed at a later point in the process, the nitride film may not be formed. A trench fill material 224 is deposited over the trench liner 222. In an embodiment, the trench fill material 224 can completely fill the trenches 152 or be deposited to seal off the trenches 152 and form voids within the trenches 152. In an embodiment, the trench fill material 224 can be an insulator and include an oxide, a nitride, an oxynitride, and may include a single film or a plurality of films. In another embodiment, the insulating material can be removed from the trenches 152 in the field-stop region 128, and a conductive material can be formed within such trenches 152 to allow for a lower resistance connection between the drain ring 268 and the substrate 200.

In the embodiment as illustrated in FIG. 8, the trench fill material 224 does not completely fill the trenches 152 near the primary surface 205 and leaves recessions along the surface. The recessions can be filled with a semiconductor material or insulating material. A layer of sufficient thickness is deposited along the exposed surface of the workpiece and fills in the recessions. Further processing of such layer can depend on the material of the layer and whether islands of the layer are to remain within the trenches 152. In an embodiment, the layer includes a semiconductor material and semiconductor islands 826 are formed, as illustrated in FIG. 8. A planarization operation is performed to remove the layer except within the recessions. An etch is performed to recess portions of the layer within the recessions to form the semiconductor islands 826. In another embodiment, the layer includes an insulating material. In a particular embodiment, a planarization operation is performed to remove portions of the layer and any trench fill material that overlies the doped region 206. In this embodiment, no semiconductor islands are formed.

Figure 9:
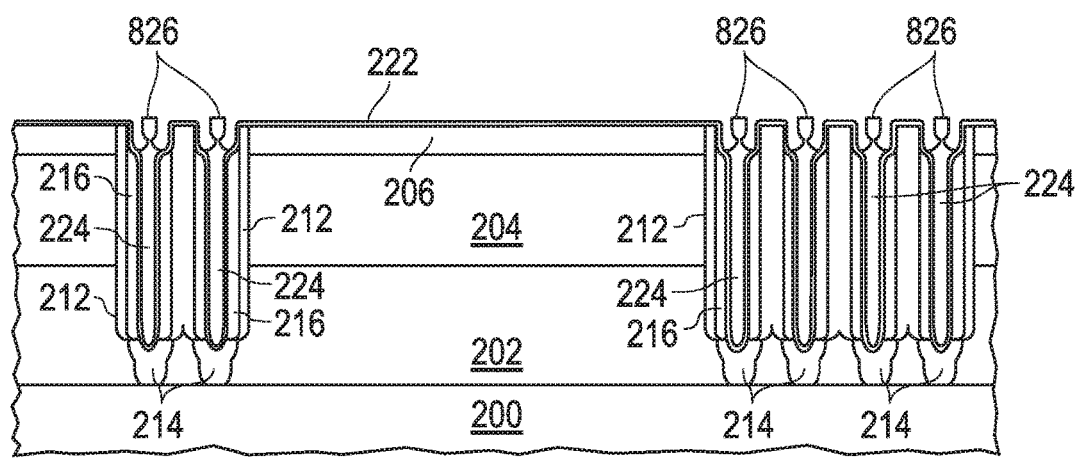
FIG. 9 includes an illustration of a cross-sectional view the workpiece of FIG. 8 after removing portions of the trench liner and trench fill material.

Referring to FIG. 9, an isotropic etch is performed to remove any remaining portion of the trench fill material 224 outside the trenches 152 and to remove portions of the trench fill material 224 within the trenches 152. When the trench fill material 224 includes an oxide, and the trench liner 222 includes a nitride film, the isotropic etch can be performed with an oxide etchant that stops on the nitride film of the trench liner 222. When the trench liner 222 only includes oxide, the isotropic etch removes portions of the trench liner 222 adjacent to the tops of the trenches 152 to expose portions of the charge compensation regions 212, pillars 154, and the superjunction layers 216. In an embodiment in which semiconductor islands 826 are formed, the isotropic etch may be performed so that etch does not completely undercut the semiconductor islands 826. The semiconductor islands 826 may or may not be removed at this point in the process. In an embodiment where semiconductor islands 826 are not formed, undercut concerns are obviated.

Figure 11:
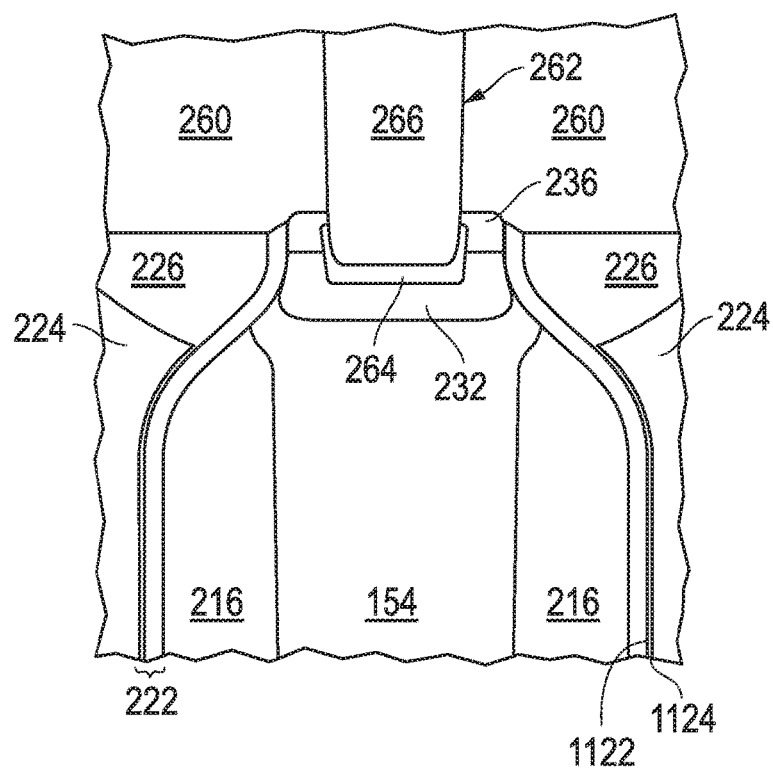
FIG. 11 includes an illustration of a cross-sectional view of an enlarged view of a gate region of a transistor structure within the active region.

Referring briefly to FIG. 11, if the trench liner 222 includes a nitride film 1124, exposed portions of the nitride film 1124 can be removed to expose an underlying gate dielectric layer 1122. If the trench liner 222 does not include the nitride film 1124, the gate dielectric layer 1122 is formed along exposed portions of the charge compensation regions 212 and superjunction layers 216.

Figure 10:
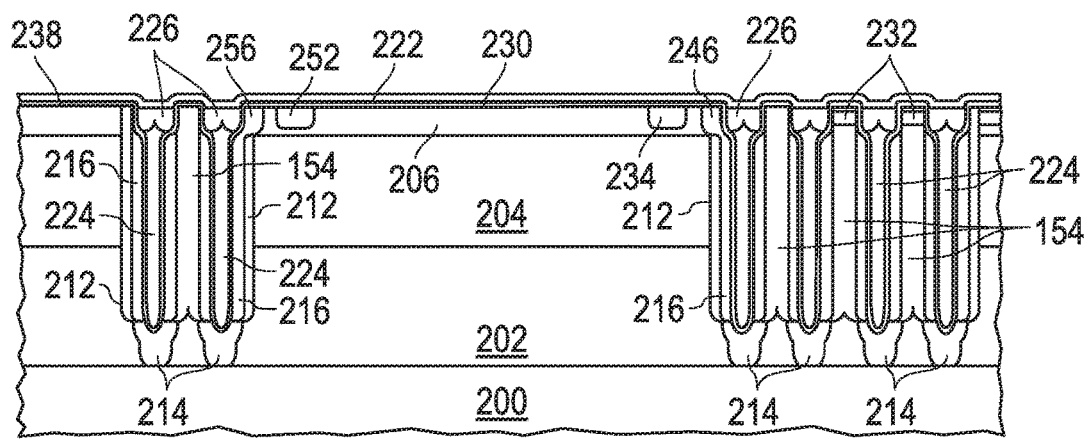
FIG. 10 includes an illustration of a cross-sectional view the workpiece of FIG. 9 after forming gate electrodes and doping regions near the primary surface.

Referring to FIG. 10, gate electrodes 226 can be formed at this point in the process. If the semiconductor islands 826 are present, the semiconductor islands 826 can be part of the gate electrodes 226. A heavily doped semiconductor layer can be formed over exposed portions of the workpiece, and portions of the heavily doped semiconductor layer can be removed by an etch-back process or planarization to form the gate electrodes 226.

Body regions 232 can be formed in the active region 122 of the semiconductor die 100. The body regions 232 can be used to control the threshold voltage of the transistor structures. The body regions 232 may not be formed within the current barrier region 124, the intermediate region 126, and the field-stop region 128. Near the right-hand side of the FIG. 10, the pillar 154 closest to the intermediate region 126 does not have a body region 232.

The body extension region 234 can be formed within the intermediate region 126 and can help to reduce resistance between the source terminal and the upper semiconductor layer 204. The body extension region 234 is spaced apart from the trenches 152 and the current barrier region 124. In a particular embodiment, a gap between the trench 152 of the current barrier region 124 and the body extension region 234 is in a range of 2 microns to 6 microns, and the body extension region 234 has a width in a range of 1 to 4 microns.

The body regions 232 and the body extension region 234 have a conductivity type opposite that of the substrate 200 and may be formed at the same or different times. In an embodiment where the body regions 232 and the body extension region 234 are formed at the same time, a mask can be formed that covers the workpiece except where the body regions 232 and the body extension region 234 are formed. In a particular embodiment, the pillar 154 shared by the current barrier region 124 and the active region 122 does not receive a body region 232, and thus, is covered by the mask. Dopant for the body regions 232 and the body extension region 234 can be implanted using a single implant or a sequence of different implants at different energies. The body regions 232 and the body extension region 234 can include a p-type dopant and have a maximum doping concentration in a range of $5 \times 10^{15}$ to $5 \times 10^{16}$ atoms/cm$^3$, and a depth in a range of 0.3 micron to 1.2 microns. The actual concentration and depth may depend on the device design, nominal operating voltage, threshold voltage, drain-to-source breakdown voltage, or the like. The mask can be removed after implantation.

Source regions 236 are formed within the active region 122, and drain surface regions 238 are formed within the field-stop region 128. A source region 236 or drain surface region 238 is not formed within the current barrier region 124 or the intermediate region 126. The source regions 236 and the drain surface regions 238 have the same conductivity type as the substrate 200. In an embodiment, the source and drain surface regions 236 and 238 can include an n-type dopant and have a dopant concentration greater than $1 \times 10^{19}$ atoms/cm$^3$.

Additional doped regions may be formed within intermediate region 126 near the primary surface 205. Such additional doped regions can help to increase the likelihood that a drain-to-source breakdown occurs within the active region 122 instead of near the current barrier region 124 or the intermediate region 126. The additional doped regions can include an inner drain extension region 246, an outer drain extension region 256, and a floating doped region 252.

The surface-doped region 246, which in the embodiment illustrated is an inner drain extension region, lies within the intermediate region 126 adjacent to the current barrier region 124. The surface-doped region 246 allows the voltage at the primary surface 205 adjacent to the current barrier region 124 to be in a range of 10 V to 20 V. The increased voltage at the primary surface 205 allows a smaller voltage difference to be present between the substrate 200 and the primary surface 205. Thus, the termination structure can be designed to withstand 220 V to 230 V when the voltage difference between the drain and source terminals is at 240 V. The surface-doped region 246 contacts the superjunction layer 216 and extends to a distance in a range of 1 to 5 microns from the sidewall of the trench 152. In an embodiment, the surface-doped region 246 does not overlap the body extension region 234. No overlap helps to keep the breakdown voltage within the termination structure sufficiently high.

The surface-doped region 256, which in the embodiment illustrated is an outer drain extension region, lies within the intermediate region 126 adjacent to the field-stop region 128. The surface-doped region 256 can help to reduce the electrical field within the intermediate region 126 at the primary surface 205 near the field-stop region 128. The increased voltage at the primary surface 205 allows a smaller voltage difference to be present between the substrate 200 and the primary surface 205. The surface-doped region 256 contacts the superjunction layer 216 and extends to a distance in a range of 1 to 4 microns from the sidewall of the trench 152.

The surface-doped region 252, which in the embodiment illustrated is a floating doped region, lies within the intermediate region 126 and is closer to the drain terminal than to the source terminal. The surface-doped region 252 electrically floats and can help to reduce peak electric field along the primary surface 205 within the intermediate region 126. In an embodiment, the center of the surface-doped region 252 is in a range of 10% to 40% of the distance from the field-stop region 128 to the current barrier region 124. In another embodiment, more than one floating doped region may be used.

The surface-doped region 246, the surface-doped region 256, and the surface-doped region 252 have the same conductivity type as the substrate 200. The surface-doped region 246, the surface-doped region 256, and the surface-doped region 252 may be formed at the same time or at different times. In an embodiment where the surface-doped region 246, the surface-doped region 256, and the surface-doped region 252 are formed at the same time, a mask is formed with openings under which the surface-doped region 246, the surface-doped region 256, and the surface-doped region 252 are formed. In an embodiment, an n-type dopant is implanted so that the surface-doped region 246, the surface-doped region 256, and the surface-doped region 252 have a peak dopant concentration in a range of $5 \times 10^{15}$ to $5 \times 10^{16}$ atoms/cm$^3$ and a depth in a range of 1 micron to 2 microns.

An ILD layer 260 is formed and patterned to define contact openings 262. The ILD layer 260 can include one or more films of oxide, nitride, or oxynitride, and such films may be doped or undoped. The ILD layer 260 can be formed by chemical or vapor phase deposition. A mask is formed over the ILD layer 260 and defines openings that expose portions of the ILD layer 260 where the contact openings 262 are formed. An etch is performed to etch through the ILD layer 260, the source regions 236, and the surface drain region 238. Body contact regions 264 can be formed along the bottoms of the contact openings 262. The body contact regions 264 are heavily doped and kept as shallow as reasonably possible. The mask is removed.

A metal layer is deposited and patterned to from a source electrode 266, a gate terminal (not illustrated) electrically connected to the gate electrodes 226, and the drain seal ring 268. The metal layer may include one or more films that can include an adhesion film, a barrier film, and a bulk film that makes up most of the metal layer. The source electrode 266 and the drain seal ring 268 can extend into the intermediate region 126 to help with shielding. The source electrode 266 may extend beyond the contact opening for the body extension region 234 by a distance in a range of 2 microns to 10 microns. The drain seal ring 268 may extend beyond the center of the rightmost trench in the field-stop region 128 by a distance in a range of 2 microns to 10 microns. The spacing between the source electrode 266 and the drain seal ring 268 may be at least 4 microns.

A passivation layer 270 is formed over the ILD layer 260, the source electrode 266, a gate terminal, and drain seal ring 268. The passivation can include one or more films of a insulating material. In a particular embodiment, the passivation layer 270 include polyimide that is coated and pattern to expose portions of the source electrode 266 and the gate terminal. The reverse side of the semiconductor die 100 may then be provided with a drain electrode that contacts the substrate 200.

The semiconductor die 100 can be put into a package, and the packaged die may be mounted on a circuit or printed wiring board. Thus, the electronic device can be the semiconductor die, the packaged die, the circuit or printed wiring board, at a higher level within an apparatus, or the like.

The embodiments described above address n-channel FET structures within the active region. For p-channel FET structures, opposite dopant types can be used. In embodiments described above, the semiconductor material can be silicon. In other embodiment, other semiconductor materials, such as silicon carbide, germanium, Group 13-Group 15, or other materials capable of forming a rectifying junction can be used. The actual dopants used may depend on the principal compound making up the semiconductor material.

Much of the description above is based on designs for a transistor with a nominal drain-to-source voltage of 200 V (e.g., normal operating voltage) and capable of withstanding a drain-to-source voltage of 240 V before avalanche breakdown occurs. The embodiments described herein may be used for other drain-to-source voltages, such as 100 V to 900 V and even higher. The thicknesses of the semiconductor layer(s) and width of the intermediate region may be increased for higher drain-to-source voltages and decreased for lower drain-to-source voltages. Similarly, the number of trenches and pillars within the current-barrier and field-stop regions may be increased for higher drain-to-source voltages. Further, the number of floating doped regions within the intermediate region may be increased for higher drain-to-source voltages. After reading this specification, skilled artisans will be able to determine thicknesses of layers, numbers of various types of structures, and dopant concentrations and depths to resist avalanche breakdown within a termination structure for a particular drain-to-source voltage.

Embodiments as described herein can allow the termination structure to be more robust as compared to conventional designs. A body extension region within the intermediate region and spaced apart from a trench within a current barrier region can help to reduce the electrical field seen at the body extension region. Further, an inner drain extension region allows a resistive connection to be made to the substrate, such that the voltage at the primary surface adjacent to the body extension region may be in a range of 10 V to 20 V. Thus, the termination structure may have a 10 V to a 20 V effective reduction in the voltage difference it can support as compared to the voltage difference for transistor structures within the active region. Thus, the termination structure can be subjected to a higher drain-to-substrate voltage before breaking down as compared to a conventional design. Alternatively, the intermediate region of the termination structure may be narrower as compared to a conventional design, and still support the same drain-to-source voltage.

The outer drain extension region can be used to help reduce the electrical field within the semiconductor layers along the edge of the field-stop regions. The floating doped region can help to spread more evenly the electrical field along the primary surface within the intermediate region of the termination structure. The floating doped region may be particularly useful for nominal drain-to-source voltages of 200 V and higher. More floating doped regions can be used if needed or desired.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An electronic device can include a termination structure. The termination structure can including a substrate including a semiconductor material of a first conductivity type; a first semiconductor layer of a second conductivity type opposite the first conductivity type, wherein the first semiconductor layer overlies the substrate and has a primary surface; a first trench extending through a majority of a thickness of the first semiconductor layer; and a body extension region of the second conductivity type adjacent to the primary surface of the first semiconductor layer and spaced apart from the first trench.

Embodiment 2

The electronic device of Embodiment 1, further including a first doped region of the first conductivity type, wherein the first doped region is adjacent to the primary surface of the first semiconductor layer and disposed between the first trench and the body extension region.

Embodiment 3

The electronic device of Embodiment 2, wherein the first doped region abuts the first trench.

Embodiment 4

The electronic device of Embodiment 3, further including a second trench extending through at least part of the first semiconductor layer and spaced apart from first trench and the first doped region; and a second doped region of the first conductivity type, wherein the second doped region is disposed between and spaced apart from the body extension region and the second trench.

Embodiment 5

The electronic device of Embodiment 4, wherein the second doped region electrically floats.

Embodiment 6

The electronic device of Embodiment 1, further including a first doped region of the first conductivity type extending along a majority of the first trench.

Embodiment 7

The electronic device of Embodiment 6, wherein the first doped region is spaced apart from the primary surface of the first semiconductor layer.

Embodiment 8

The electronic device of Embodiment 7, further including a second semiconductor layer of the first conductivity type disposed between the substrate and the first semiconductor layer, wherein the second semiconductor layer has a lower dopant concentration as compared to each of the first doped region and the substrate.

Embodiment 9

The electronic device of Embodiment 1, further including a first metal contact to the body extension region.

Embodiment 10

The electronic device of Embodiment 9, further including a second trench extending through a majority of a thickness of the first semiconductor layer; a semiconductor material of a second conductivity type disposed between the first and second trenches and having a dopant concentration no greater than $10^{17}$ atoms/cm$^3$; and a second metal contact to the semiconductor material between the first and second trenches, wherein the semiconductor material does not include a body region where the second metal contact contacts the semiconductor material.

Embodiment 11

The electronic device of Embodiment 1, further including:
- a second semiconductor layer of the first conductivity type disposed between the substrate and the first semiconductor layer;
- a second trench extending through a majority of thicknesses of the first and second semiconductor layers and spaced apart from the first trench;
- a first doped region of the first conductivity type, wherein the first doped region is adjacent to the primary surface of the first semiconductor layer, disposed between the first trench and the body extension region, and abutting the first trench; and
- a second doped region of the first conductivity type, wherein the second doped region is spaced apart from the primary surface of the first semiconductor layer, extends along most of the first trench, and is along a conduction path between the first doped region and the substrate, wherein:
- each of the first and second doped regions has a higher dopant concentration as compared to each of the first and second semiconductor layers; and
- each of the first and second doped regions has a lower dopant concentration as compared to the substrate.

Embodiment 12

The electronic device of Embodiment 11, further including a third doped region of the first conductivity type, wherein the third doped region is disposed between and spaced apart from the body extension region and the second trench, and wherein the third doped region electrically floats, has a higher dopant concentration as compared to each of the first and second semiconductor layers, and has a lower dopant concentration as compared to the substrate.

Embodiment 13

An electronic device can include a termination structure. The termination structure can include a substrate including a semiconductor material of a first conductivity type; a first semiconductor layer of a second conductivity type opposite the first conductivity type, wherein the first semiconductor layer overlies the substrate and has a primary surface; a first trench extending through a majority of a thickness of the first semiconductor layer; and a first doped region of the first conductivity type adjacent to the primary surface of the first semiconductor layer and abutting the first trench.

Embodiment 14

The electronic device of Embodiment 13, further including a second trench extending through at least part of the first semiconductor layer and spaced apart from first trench and the first doped region; and a second doped region of the first conductivity type adjacent to the primary surface of the first semiconductor layer and abutting the second trench.

Embodiment 15

The electronic device of Embodiment 13, further including a second semiconductor layer of the first conductivity type disposed between the substrate and the first semiconductor layer; and a second doped region of the first conductivity type extending along a majority of the first trench, wherein the second doped region has a higher dopant concentration as compared to each of the first and second semiconductor layers.

Embodiment 16

The electronic device of Embodiment 15, wherein the second doped region is along a conduction path between the first doped region and the substrate.

Embodiment 17

The electronic device of Embodiment 15, further including an active region, wherein the electronic device is configured such that a drain-to-source avalanche breakdown is lower within the active region as compared to within the termination structure.

Embodiment 18

The electronic device of Embodiment 15, further including a body extension region of the second conductivity type adjacent to the primary surface of the first semiconductor layer, and the first doped region is disposed between body extension region and the first trench.

Embodiment 19

An electronic device can include a termination structure. The termination structure can include a substrate including a semiconductor material of a first conductivity type; a first semiconductor layer of second conductivity type opposite the first conductivity type, wherein the first semiconductor layer overlies the substrate and has a primary surface; a first trench extending through a majority of a thickness of the first semiconductor layer; a second trench extending through a majority of the thickness of the first semiconductor layer and spaced apart from the first trench; and a first doped region of the first conductivity type, wherein the first doped region is adjacent to the primary surface of the first semiconductor layer and spaced apart from the first and second trenches.

Embodiment 20

The electronic device of Embodiment 19, wherein the first doped region electrically floats.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device including a termination structure, the termination structure comprising:
a substrate including a semiconductor material of a first conductivity type;
a first semiconductor layer of a second conductivity type opposite the first conductivity type, wherein the first semiconductor layer overlies the substrate and has a primary surface;
a first trench extending through a majority of a thickness of the first semiconductor layer;
a second trench extending through at least part of the first semiconductor layer and spaced apart from the first trench; and
a body extension region of the second conductivity type along the primary surface of the first semiconductor layer and spaced apart from and between the first and second trenches, wherein the body extension region has a higher dopant concentration than the first semiconductor layer; and
a first doped region of the first conductivity type along the primary surface of the first semiconductor layer and disposed between the first and second trenches.

2. The electronic device of claim 1, wherein the first doped region is disposed between the first trench and the body extension region.

3. The electronic device of claim 2, wherein the first doped region abuts the first trench.

4. The electronic device of claim 3, wherein the first doped region is disposed between and spaced apart from each of the body extension region and the second trench.

5. The electronic device of claim 4, wherein the first doped region electrically floats.

6. The electronic device of claim 1, further comprising a second doped region of the first conductivity type extending along a majority of the first trench.

7. The electronic device of claim 6, wherein the second doped region is spaced apart from the primary surface of the first semiconductor layer.

8. The electronic device of claim 7, further comprising a second semiconductor layer of the first conductivity type disposed between the substrate and the first semiconductor layer, wherein the second semiconductor layer has a lower dopant concentration as compared to each of the first doped region and the substrate.

9. The electronic device of claim 1, further comprising a first metal contact to the body extension region.

10. The electronic device of claim 9, further comprising:
a semiconductor material of a second conductivity type disposed between the first and second trenches and having a dopant concentration no greater than $10^{17}$ atoms/cm$^3$; and
a second metal contact to the semiconductor material between the first and second trenches, wherein the semiconductor material does not include a body region where the second metal contact contacts the semiconductor material.

11. The electronic device of claim 1, further comprising:
a second semiconductor layer of the first conductivity type disposed between the substrate and the first semiconductor layer; and
a second doped region of the first conductivity type, wherein the second doped region is spaced apart from the primary surface of the first semiconductor layer, extends along most of the first trench, and is along a conduction path between the first doped region and the substrate,
wherein each of the first and second doped regions has a higher dopant concentration as compared to each of the first and second semiconductor layers.

12. The electronic device of claim 11, further comprising a third doped region of the first conductivity type, wherein:
the first doped region abuts the first trench;
the third doped region is spaced apart from the body extension region and the first and second trenches; and
the third doped region electrically floats and has a higher dopant concentration as compared to each of the first and second semiconductor layers.

13. An electronic device including a termination structure, the termination structure comprising:
a substrate including a semiconductor material of a first conductivity type;

a first semiconductor layer of a second conductivity type opposite the first conductivity type, wherein the first semiconductor layer overlies the substrate and has a primary surface;

a first trench extending through a majority of a thickness of the first semiconductor layer;

a first doped region of the first conductivity type adjacent to the primary surface of the first semiconductor layer and abutting the first trench; and a body extension region of the second conductivity type adjacent to the primary surface of the first semiconductor layer, and the first doped region is disposed between the body extension region and the first trench.

14. The electronic device of claim 13, further comprising:
a second trench extending through at least part of the first semiconductor layer and spaced apart from first trench and the first doped region; and a second doped region of the first conductivity type adjacent to the primary surface of the first semiconductor layer and abutting the second trench.

15. The electronic device of claim 13, further comprising:
a second semiconductor layer of the first conductivity type disposed between the substrate and the first semiconductor layer; and a second doped region of the first conductivity type extending along a majority of the first trench, wherein the second doped region has a higher dopant concentration as compared to each of the first and second semiconductor layers.

16. The electronic device of claim 15, wherein the second doped region is along a conduction path between the first doped region and the substrate.

17. The electronic device of claim 15, further comprising an active region, wherein the electronic device is configured such that a drain-to-source avalanche breakdown is lower within the active region as compared to within the termination structure.

18. The electronic device of claim 15, further comprising a second doped region of the first conductivity type, wherein the second doped region is adjacent to the primary surface of the first semiconductor layer, and the body extension region is disposed between the first and second doped regions.

19. An electronic device including a termination structure, the termination structure comprising:
a substrate including a semiconductor material of a first conductivity type;

a first semiconductor layer of second conductivity type opposite the first conductivity type, wherein the first semiconductor layer overlies the substrate and has a primary surface;

a first trench extending through a majority of a thickness of the first semiconductor layer;

a first doped region underlying the first trench and extending to the substrate;

a second trench extending through a majority of the thickness of the first semiconductor layer and spaced apart from the first trench;

a second doped region underlying the second trench, extending to the substrate, and spaced apart from the first doped region; and a third doped region of the first conductivity type, wherein the third doped region is adjacent to the primary surface of the first semiconductor layer and spaced apart from the first and second trenches.

20. The electronic device of claim 19, wherein the first doped region electrically floats.

* * * * *